(12) United States Patent
Zhao et al.

(10) Patent No.: US 7,029,967 B2
(45) Date of Patent: Apr. 18, 2006

(54) SILICIDE METHOD FOR CMOS INTEGRATED CIRCUITS

(75) Inventors: Song Zhao, Plano, TX (US); Sue E. Crank, Coppell, TX (US); Amitava Chatterjee, Plano, TX (US); Kaiping Liu, Plano, TX (US); Jiong-Ping Lu, Richardson, TX (US); Donald S. Miles, Plano, TX (US); Duofeng Yue, Plano, TX (US); Lance S. Robertson, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 10/896,599

(22) Filed: Jul. 21, 2004

(65) Prior Publication Data

US 2006/0019478 A1    Jan. 26, 2006

(51) Int. Cl.
*H01L 21/8238* (2006.01)
*H01L 21/331* (2006.01)

(52) U.S. Cl. ............ 438/199; 438/223; 438/230; 438/369

(58) Field of Classification Search ............. 438/199, 438/223, 224–228, 369–373, 230
See application file for complete search history.

(56) References Cited

U.S. PATENT DOCUMENTS

| 6,555,880 B1* | 4/2003 | Cabral et al. ............ 257/384 |
| 2004/0023478 A1* | 2/2004 | Samavedam et al. ....... 438/592 |

* cited by examiner

*Primary Examiner*—Cuong Nguyen
(74) *Attorney, Agent, or Firm*—Peter K. McLarty; W. James Brady, III; Frederick J. Telecky, Jr.

(57) ABSTRACT

A method for forming metal silicide regions in source and drain regions (160, 170) is described. Prior to the thermal annealing of the source and drain regions (160, 170), germanium is implanted into a semiconductor substrate adjacent to sidewall structures (90, 95) formed adjacent gate structures (60, 70). The position of the implanted germanium species in the semiconductor substrate will overlap the source and drain regions (160, 170). Following thermal annealing of the source and drain regions (160, 170), the implanted germanium prevents the formation of metal silicide spikes.

12 Claims, 5 Drawing Sheets

SILICIDE METHOD FOR CMOS INTEGRATED CIRCUITS

FIELD OF THE INVENTION

The invention is generally related to the field of MOSFET transistors and more specifically to a method of forming nickel silicide on the gate and source drain regions of CMOS transistors.

BACKGROUND OF THE INVENTION

Complementary metal-oxide-semiconductor (CMOS) transistors in high performance integrated circuits require a low resistance electrical contact to the gate and source/drain regions of the transistors. In forming this contact, a silicide layer is first formed on the transistor gate and source/drain regions. A self aligned silicidation process (salicide) is often used to form the silicide layers. In this process, a blanket metal film is first deposited on the silicon substrate containing the MOS transistor structure. The metal is then reacted with the underlying silicon regions to form a low resistance metal silicide layer. Any un-reacted metal remaining on the substrate is then removed using a metal etch process that is selective to the metal silicide present. During this process it is critical that the metal silicide layer not penetrate into and/or through the underlying source/drain regions. Such metal silicide penetration, if it occurs, can lead to increased leakage currents rendering the integrated circuit inoperable.

Given its low resistivity and low temperature of formation (<400° C.), nickel silicide (NiSi) is increasingly being used to form the silicide layers in integrated circuits. Current methods of nickel silicide formation often results in an uneven nickel silicide semiconductor interface caused by spiking of nickel di-silicide ($NiSi_2$) into the underlying semiconductor during formation. As described above, nickel disilicide spiking leads to increased transistor leakage currents and possible failed integrated circuits. There is therefore a need for a nickel silicide formation process that eliminates silicide spiking during formation.

SUMMARY OF THE INVENTION

A method for forming metal silicide regions in integrated circuits is described. The method comprises implanting germanium into the source and drain regions of MOS transistors prior to thermally anneal the source and drain regions. Germanium may also be implanted into the semiconductor substrate prior to the formation of the source and drain regions. A metal layer is formed over the germanium containing source and drain regions and annealed to form nickel silicide regions without nickel silicide spiking.

Figure 1:
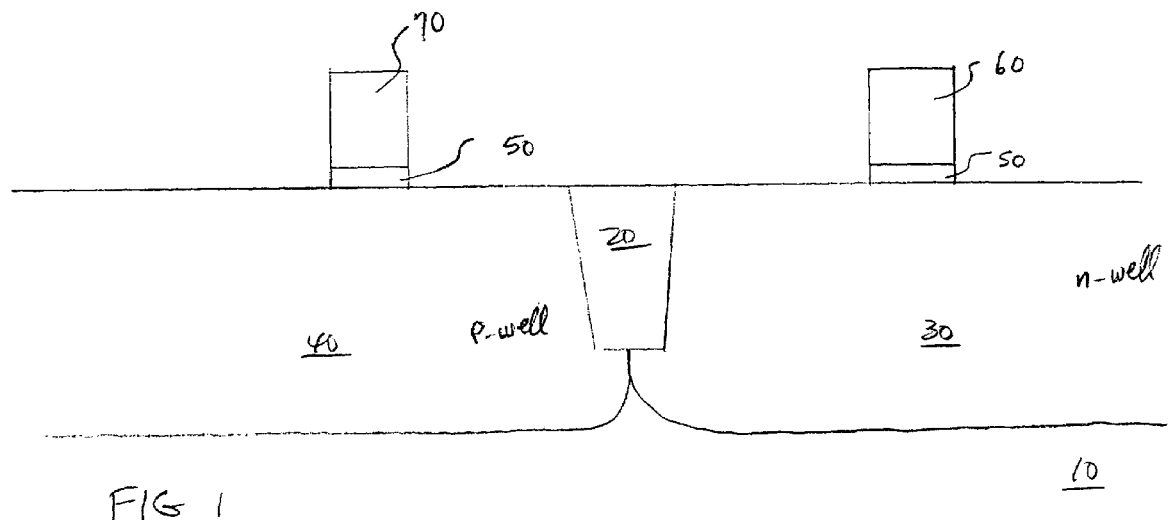
FIG. 1–FIG. 6 are cross-sectional diagrams showing an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIG. 1–FIG. 6, the instant invention can be utilized in many semiconductor device structures. The methodology of the instant invention provides a solution to eliminate silicide spiking during the forming of the metal silicide regions.

An embodiment of the instant invention will now be described by referring to FIG. 1–FIG. 6. Referring to FIG. 1, a silicon body 10 is provided. Dielectric isolation structures 20 are formed in the silicon body 10. The dielectric isolation structures can comprise silicon oxide or any other suitable dielectric material and can be formed using shallow trench isolation (STI) methods. N-type well (n-well) regions 30 and P-type well (p-well) regions 40 are formed in the silicon body. The n-well region 30 is formed by implanting n-type dopants such as arsenic and/or phosphorous into the semiconductor body using ion implantation techniques. In a similar manner, p-well region 40 is formed by implanting p-type dopants such as boron into the semiconductor body using ion implantation techniques. A gate dielectric layer 50 is formed on the silicon body and a blanket polycrystalline silicon (polysilicon) layer is formed over the gate dielectric layer 50. The gate dielectric 50 may, for example comprise a silicon oxide, a nitride, an oxynitride, or any combination thereof, and is preferably on the order of 0.5 to 10 nm thick. The gate dielectric layer 50 may also comprise a high dielectric constant (high k) material such hafnium oxide, hafnium oxynitride, or other suitable material. In this disclosure high k refers to dielectric material with dielectric constants greater than 4.0. Following the formation of the blanket polysilicon layer, the polysilicon layer (and the dielectric layer 50 in some cases) is etched to form the polysilicon transistor gate structures 60 and 70 shown in FIG. 1. The gate structure 60 will form the gate of the PMOS transistor and the gate structure 70 will form the gate of the NMOS structure. In the above described embodiment the gate structures 60, 70 are formed using polysilicon. In further embodiments of the instant invention, the MOS transistor gate structures 60 and 70 can be formed using metals such as titanium, platinum, tungsten, metal silicides such as nickel silicide, cobalt silicide, tungsten silicide, titanium silicide, various layers of the above described metals, metal silicides, polysilicon, or any suitable combination of materials.

Figure 2:
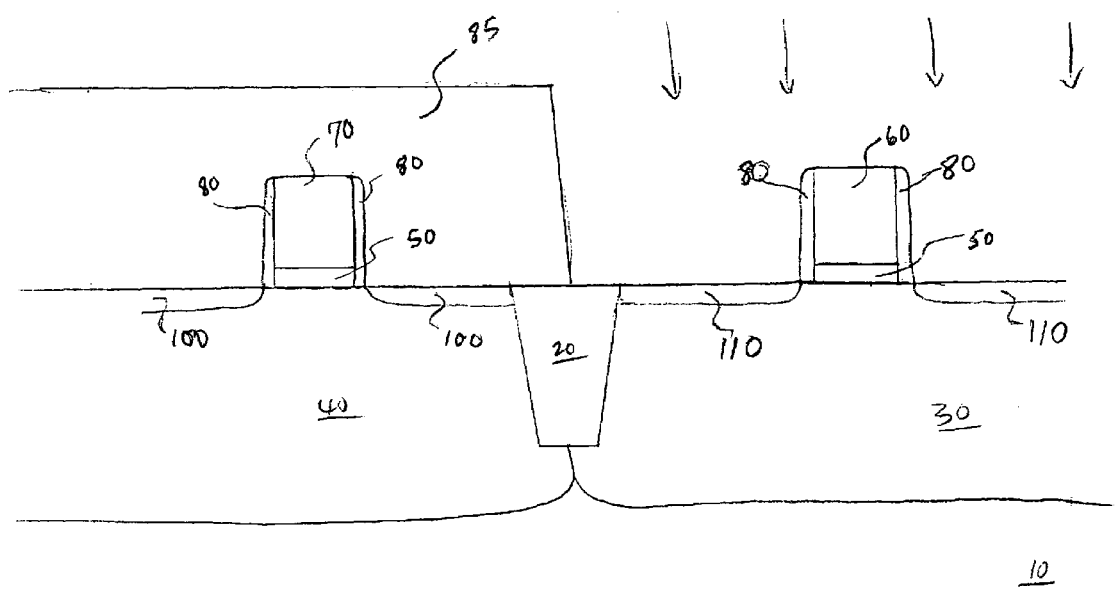

Following the formation of the gate structures shown in FIG. 1, spacer layers 80 are formed adjacent to the gate structures 60, 70. The spacer layers 80 can comprise any number of layers of silicon oxide, silicon nitride, and/or silicon oxynitride. In an embodiment of the instant invention, the spacer layers 80 comprise a first layer of between 10 to 90 angstroms of silicon oxide that can be thermally grown or deposited. A second layer of between 30 to 140 angstroms of silicon nitride can be formed over the first layer of silicon oxide. The second layer of silicon nitride can be formed using a chemical vapor deposition process. It should be noted that the second nitride layer is optional and the spacer layer can be comprised solely of the first silicon oxide layer. Alternatively, the spacer layer 80 can comprise a silicon oxide layer during the formation of the n-type source and drain extension regions 100, and the optional second silicon nitride layer added before the formation of the p-type source and drain extension regions 110. Following the formation of the spacer layers 80, the source and drain extension regions 100, 110 are formed using a self aligned ion implantation process as shown in FIG. 2. For the NMOS transistor, drain source extension regions 100 are formed by implanting n-type dopants such as arsenic and/or phosphorous into the p-well region 40 adjacent to the gate structure 70 and the underlying gate dielectric layer 50. In addition to the formation of the n-type source and drain extension regions 100, other implantation processes such as the implantation of p-type species for the formation of the p-type pocket regions in the p-well regions can also be performed. During the formation of the n-type source and drain extension regions 100 other areas of the silicon body will be covered by an implant mask to prevent the implanted species from entering the covered areas. Following the formation of the n-type source and drain extension regions 100, a masking layer is formed over the p-well region 40 that selectively exposes the n-well region 30. The p-type source and drain extension regions 110 are then formed adjacent to the gate structure 60 and the gate dielectric layer by implantation p-type dopants such as boron in the n-well region 30. In addition to the formation of the p-type source and drain extension regions 110, other implantation processes such as the implantation of n-type species for the formation of the n-type pocket regions in the n-well region 30 can also be performed.

Following the formation of the source and drain extension regions 100, 110 and any additional processes, sidewall structures 90 are formed adjacent the spacer layers 80. In a first embodiment shown in FIG. 3(*a*), the sidewall structures 90 comprise a silicon oxide layer 120, a silicon nitride layer 130, and a silicon oxide layer 140. In forming the sidewall structures 90 shown in FIG. 3(*a*), blanket layers of a first silicon oxide, silicon nitride and a second silicon oxide are first formed over the silicon body 10. An anisotropic etch is performed to remove the unwanted portions of the layers resulting in the sidewall structures 90 shown in the Figure. In an embodiment, the first silicon oxide blanket layer comprises 50 to 200 angstroms of chemical vapor deposited oxide; the silicon nitride layer comprises 180 to 350 angstroms of nitride formed using bis tertbutylamino silane (BTBAS) precursors; and the second silicon oxide blanket layer comprises 300 to 700 angstroms of oxide formed using tetra-ethyl-ortho-silicate (TEOS). Following the formation of the sidewall structures 90 shown in FIG. 3(*a*), germanium implanted regions are formed by implanting germanium into the source and drain extension regions 100, 110 adjacent the sidewall structures and also into the underlying n-well and p-well regions 30, 40. Germanium can also be implanted into the gate regions 60, 70. In an embodiment of the instant invention, the germanium species is implanted at doses of $1 \times 10^{14}$ cm$^2$ to $1 \times 10^{16}$ cm$^2$ at energies of 2 KeV to 50 KeV in single or multiple steps.

Figure 3A:
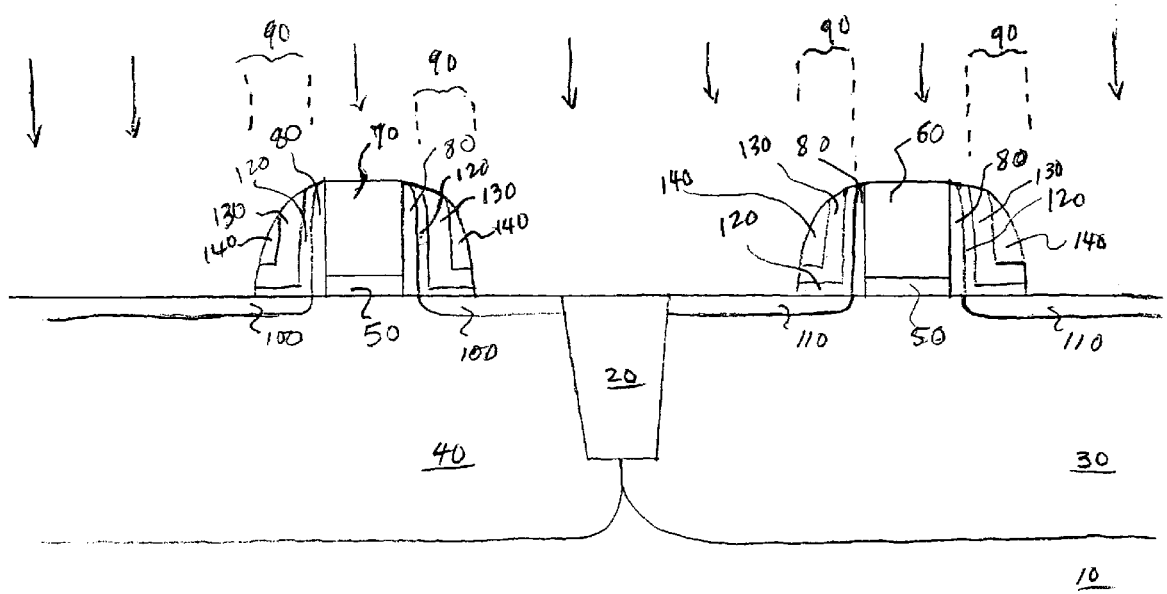
Figure 3B:
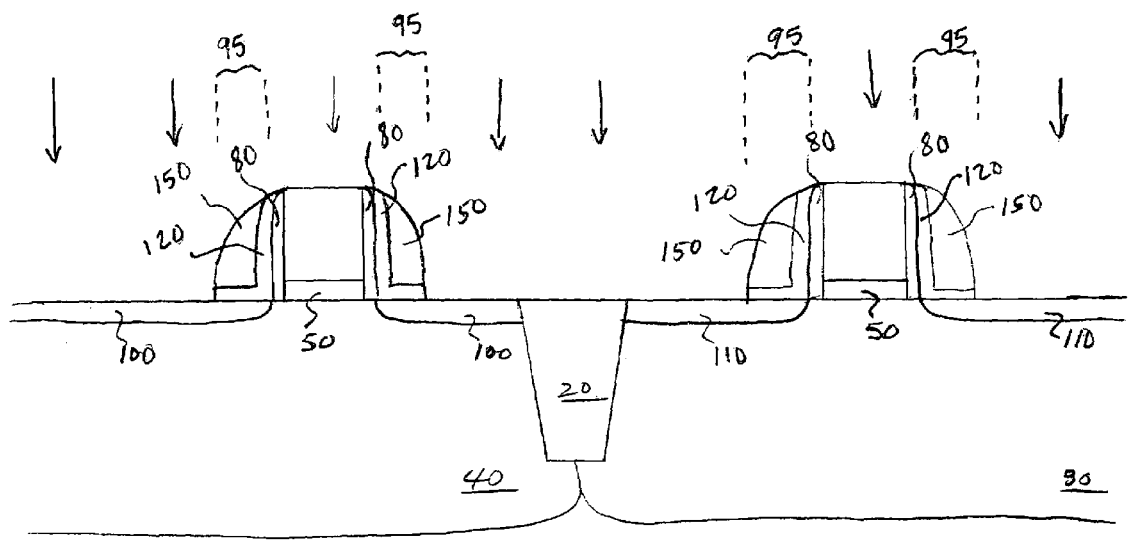

In a second embodiment shown in FIG. 3(*b*), the sidewall structures 95 comprise a silicon oxide layer 120 and a silicon nitride layer 150. In forming the sidewall structures 95 shown in FIG. 3(*b*), blanket layers of silicon oxide and silicon nitride are first formed over the silicon body 10. An anisotropic etch is performed to remove the unwanted portions of the layers resulting in the sidewall structures 95 shown in the Figure. In an embodiment, the first silicon oxide blanket layer comprises 50 to 200 angstroms of chemical vapor deposited oxide or oxide formed using tetra-ethyl-ortho-silicate (TEOS); the silicon nitride layer comprises 180 to 5000 angstroms of nitride formed using bis tertbutylamino silane (BTBAS) precursors. Following the formation of the sidewall structures 95 shown in FIG. 3(*b*), germanium implanted regions are formed by implanting germanium into the source and drain extension regions 100, 110, adjacent the sidewall structures, and also into the underlying n-well and p-well regions 30, 40. Germanium can also be implanted into the gate regions 60, 70. In an embodiment of the instant invention, the germanium species is implanted at does of $1 \times 10^{14}$ cm$^2$ to $1 \times 10^{16}$ cm$^2$ at energies of 2 KeV to 50 KeV in single or multiple steps.

Figure 4A:
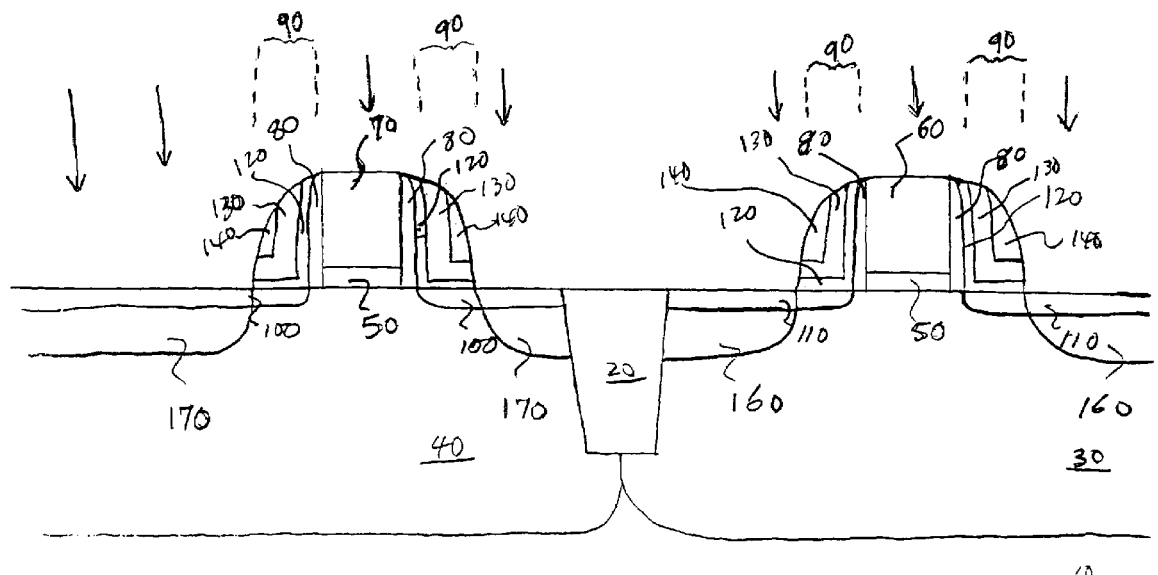
Figure 4B:
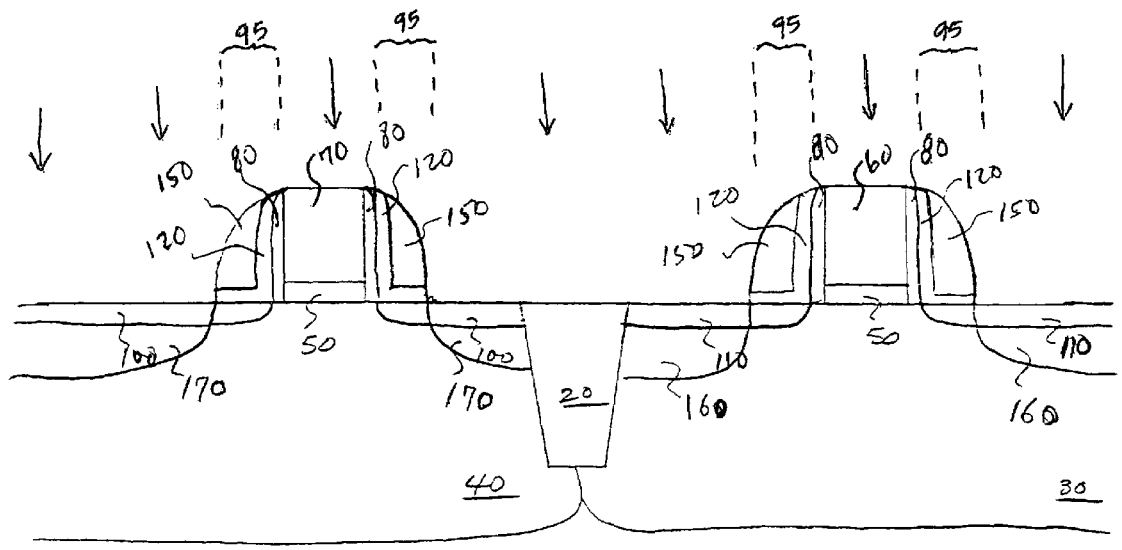

As shown in FIGS. 4(*a*) and 4(*b*), the source and drain regions 160 and 170 for the PMOS transistor and the NMOS transistor respectively are formed adjacent the sidewall structures 90, 95. In the embodiment shown in FIG. 4(*a*), the p-type source and drain regions 160 are formed by implanting p-type dopants such as boron into the n-well region 30 adjacent to the sidewall structure 90. The ion implantation process used to form the p-type source and drain regions 160 is self aligned to the sidewall structures 90. During the formation of the p-type source and drain regions 160, the NMOS transistors that are being formed in the p-well regions 40 are masked using a masking layer such as photoresist. Following the formation of the p-type source and drain regions 160, the PMOS transistor structures in the n-well regions 30 are masked using a masking layer such as photoresist, and the n-type source and drain regions 170 of the NMOS transistors are formed. The n-type source and drain regions 170 are formed by implanting n-type dopants such as arsenic and/or phosphorous into the p-well region 40 adjacent to the sidewall structures 90. It should be noted that the various source and drain regions 160, 170 will overlap at least a portion of the germanium implanted regions.

In the embodiment shown in FIG. 4(*b*), the p-type source and drain regions 160 are formed by implanting p-type dopants such as boron into the n-well region 30 adjacent to the sidewall structure 95. The ion implantation process used to form the p-type source and drain regions 160 is self aligned to the sidewall structures 95. During the formation of the p-type source and drain regions 160, the NMOS transistors that are being formed in the p-well regions 40 are masked using a masking layer such as photoresist. Following the formation of the p-type source and drain regions 160, the PMOS transistor structures in the n-well regions 30 are masked using a masking layer such as photoresist, and the n-type source and drain regions 170 of the NMOS transistors are formed. The n-type source and drain regions 170 are formed by implanting n-type dopants such as arsenic and/or phosphorous into the p-well region 40 adjacent to the sidewall structures 95. It should be noted that the various source and drain regions 160, 170 will overlap at least a portion of the germanium implanted regions.

Following the formation of the various source and drain regions 160, 170, a thermal anneal is performed. This thermal anneal (the source drain anneal) comprises a rapid thermal annealing process to remove any residual damage caused by the ion implantation process and to activate the implanted dopant species. In an embodiment, the source drain anneal comprises a rapid thermal anneal performed in a single chamber tool at temperatures greater than 1000° C.

In a further embodiment of the instant invention, the germanium implant is not performed prior to the formation of the source and drain regions 160, 170, but is instead performed after the source and drain regions 160, 170 are formed. In this embodiment, the various source and drain regions are formed as described above and no germanium implant is performed prior to the formation of the source and drain regions 160, 170. Following the formation of the source and drain regions 160, 170, germanium is implanted into the source and drain regions 160, 170, and also into the gate regions 60, 70. The germanium species can also be selectively implanted into the source and drain regions of the PMOS transistor 160 and/or the source and drain regions of the NMOS transistor 170 by performing the germanium implant in conjunction with the masking layers used for the various source and drain implant processes. In the above described embodiment, the germanium species is implanted at doses of $1 \times 10^{14}$ cm$^2$ to $1 \times 10^{16}$ cm$^2$ at energies of 2 KeV to 50 KeV in single or multiple steps. It should be noted that in either embodiment (i.e. implanting germanium into the semiconductor body 10 prior to the formation of the source and drain regions 160, 170 in a first embodiment, or implanting germanium into the semiconductor body 10 after the formation of the source and drain regions 160, 170 in a second embodiment) the source and drain thermal annealing process is performed after the germanium implant process. In embodiments where multiple-step implants are used to form the source and drain for both NMOS and PMOS transistors, the germanium implant can be implemented at during any implant step prior to the high temperature source/drain rapid thermal anneal.

Without limiting the scope of the instant invention, it is believed that during the source and drain high temperature rapid thermal anneal, Si(1-x)Ge(x) with x=1–10% can be formed in the silicide and/or underlying silicon region. In the presence of germanium, nickel silicide (NiSi) is more likely to form compared to nickel disilicide (NiSi2) which causes the silicide spikes to form.

Figure 5A:
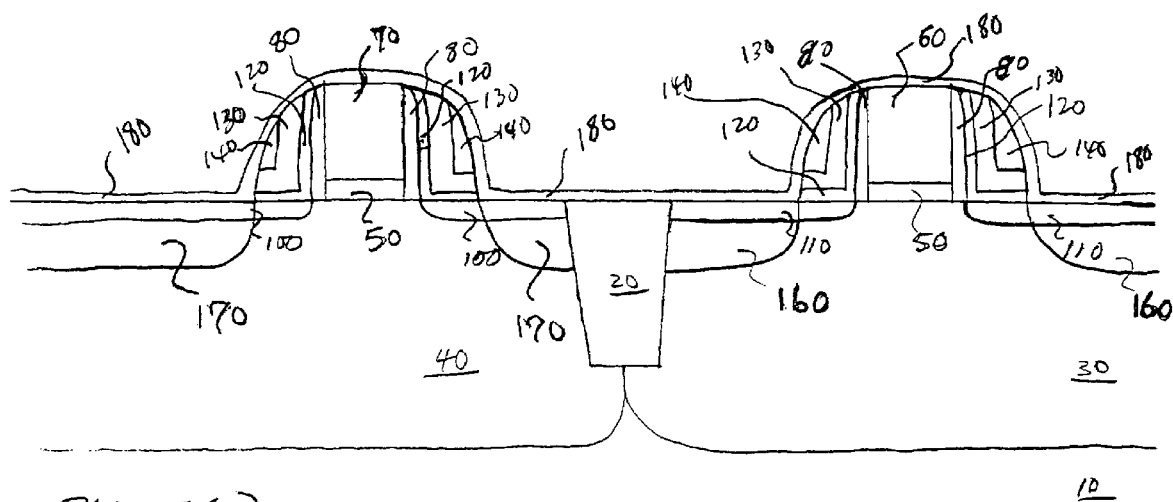
Figure 5B:
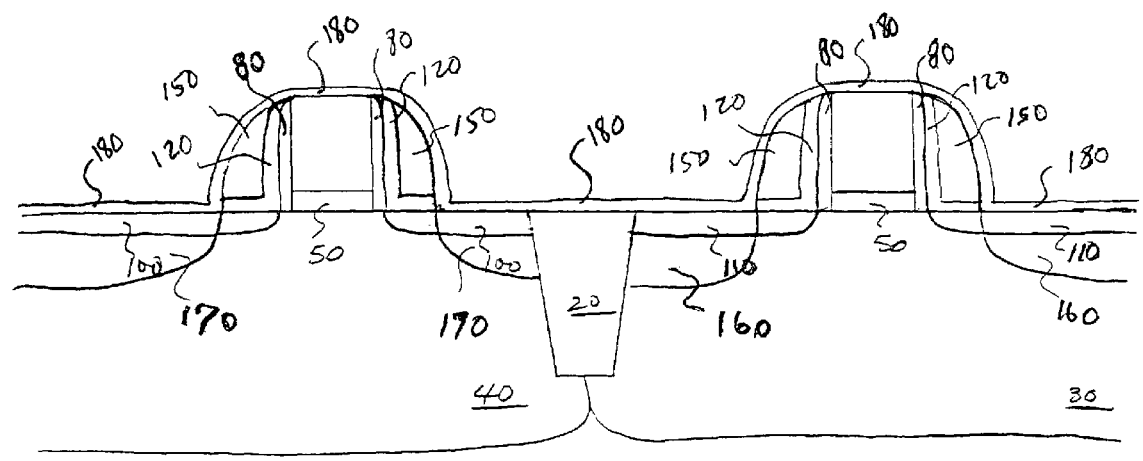

Following the source/drain anneal and any subsequent processing, a metal layer 180 is formed over the silicon body 10 as illustrated in FIGS. 5(a) and 5(b). In a first embodiment, the metal layer 180 comprises nickel with a thickness between 30 to 200 angstroms. In addition to nickel, the metal layer 180 can also be formed using cobalt as well as alloys containing nickel and/or cobalt. The metal layer 180 can also comprise multiple layers of different metals. In one such embodiment, metal layer 180 comprises a first metal layer comprising nickel and a second layer comprising titanium or titanium nitride. In this embodiment the first nickel layer is formed to thicknesses between 50 and 200 angstroms and the second titanium nitride layer formed to thicknesses between 100 and 300 angstroms. In forming the metal layer 180 over the silicon body, it is important the layer be in contact with the source and drain regions 160, 170 and in some cases the gate structures 60, 70.

Figure 6A:
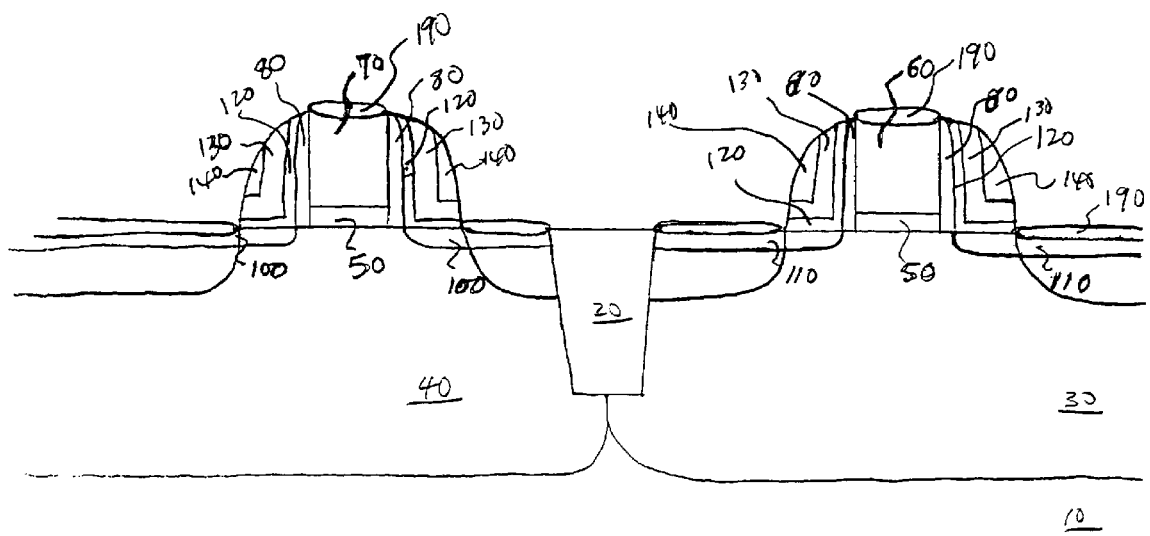
Figure 6B:
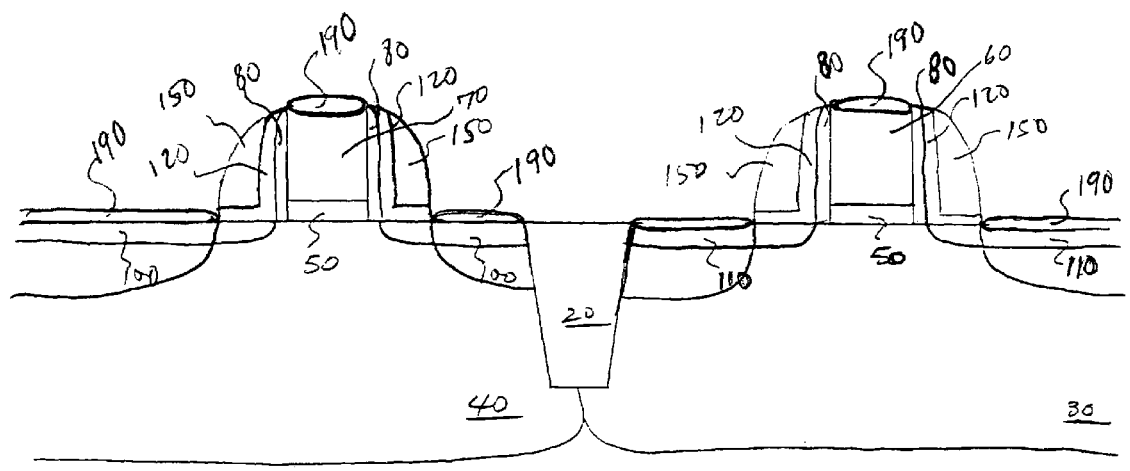

Following the formation of the metal layer 180, a thermal anneal process is performed. In an embodiment, this thermal anneal process (i.e. silicide anneal) comprises annealing the structures shown in FIGS. 5(a) and 5(b) at temperatures less than 450° C. In a further embodiment, the silicide anneal is performed at temperatures less than 350° C. During the thermal annealing, the metal layer will react with the underlying silicon to form a metal silicide. In the case where nickel is used to form the metal layer 180, nickel silicide will formed. The metal silicide will be formed over the source and drain regions 160, 170 and over the gate structures 60, 70 if the gate structures comprise polysilicon. No metal silicide will be formed over the sidewall structures. Following the thermal annealing and formation of the metal silicide regions, a chemical etch is performed to remove any unreacted metal of the metal layer 180 as well as any addition non metal silicide material that was formed. This chemical etching process will also remove any additional layers (i.e., titanium nitride) that were formed as a part of the metal layer 180. The metal silicide regions 190 formed during the above described process are shown in FIG. 6(a) and FIG. 6(b). As shown in the Figures, the metal silicide regions 190 are formed above the source and drain regions 160, 170 and the gate structures 60, 70. Following the formation of the metal silicide regions 190 shown in FIG. 6(a) and FIG. 6(b), an optional thermal anneal can be performed. In a first embodiment, such a thermal anneal comprises annealing the metal silicide regions 190 at temperatures between 350° C. and 500° C. in a nitrogen ambient.

The instant invention provides many advantages over the prior art. One such advantage is the elimination of spiking of the metal silicide regions 190 into the source and drain regions 160, 170 during the metal silicide formation process. While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of forming metal silicide regions in integrated circuits, comprising:
    forming a first gate structure over a p-well region and a second gate structure over a n-well region wherein said n-well region and said p-well region are formed in a semiconductor substrate;
    forming first sidewall structures adjacent said first gate structure and second sidewall structures adjacent said second gate structure;
    forming germanium implanted regions by implanting germanium into said p-well region adjacent said first sidewall structures and into said n-well region adjacent said second sidewall structures;
    forming source and drain regions in said p-well region adjacent said first sidewall structure and in said n-well region adjacent said second sidewall structure wherein at least a portion of said source and drain regions overlap said germanium implanted regions;
    annealing said germanium implanted regions and said source and drain regions with a rapid thermal anneal at temperatures exceeding 1000° C.;
    forming a nickel metal layer over said source and drain regions and said germanium implanted regions; and
    annealing said metal layer to form nickel silicide regions over said source and drain regions and said germanium implanted regions.

2. The method of claim 1 further comprising implanting germanium at doses of $1 \times 10^{14}$ cm$^2$ to $1 \times 10^{16}$ cm$^2$ at energies of 2 KeV to 50 KeV.

3. The method of claim 1 further comprising implanting germanium into said gate structures.

4. A method of eliminating metal silicide spikes in integrated circuits, comprising:
    forming a first gate structure over a p-well region and a second gate structure over a n-well region wherein said n-well region and said p-well region are formed in a semiconductor substrate;
    forming first sidewall structures adjacent said first gate structure and second sidewall structures adjacent said second gate structure;
    forming source and drain regions in said p-well region adjacent said first sidewall structure and in said n-well region adjacent said second sidewall structure;
    forming germanium implanted regions said source and drain regions;
    annealing said germanium implanted regions and said source and drain regions with a rapid thermal anneal at temperatures exceeding 1000° C.;
    forming a nickel metal layer over said source and drain regions; and
    annealing said metal layer to form nickel silicide regions over said source and drain regions.

5. The method of claim 4 further comprising implanting germanium at doses of $1\times10^{14}$ cm$^2$ to $1\times10^{16}$ cm$^2$ at energies of 2 KeV to 50 KeV.

6. The method of claim 4 further comprising implanting germanium into said gate structures.

7. A method of forming metal silicide regions in source and drain regions in integrated circuits, comprising:
    forming a first gate structure over a p-well region and a second gate structure over a n-well region wherein said n-well region and said p-wall region are formed in a semiconductor substrate;
    forming first sidewall structures adjacent said first gate structure and second sidewall structures adjacent said second gate structure;
    forming n-type source and drain regions in said p-well region adjacent said first sidewall structure and p-type source and drain regions in said n-well region adjacent said second sidewall structure;
    selectively forming germanium implanted regions in said n-type source and drain regions;
    annealing said germanium implanted regions and said source and drain regions with a rapid thermal anneal with temperatures exceeding 1000° C.;
    forming a nickel metal layer over said source and drain regions; and
    annealing said metal layer to form nickel silicide regions over said source and drain regions.

8. The method of claim 7 further comprising implanting germanium at doses of $1\times10^{14}$ cm$^2$ to $1\times10^{16}$ cm$^2$ at energies of 2 KeV to 50 KeV.

9. The method of claim 7 further comprising implanting germanium into said gate structures.

10. A method for selectively enhancing the formation of metal silicide regions in source and drain regions in integrated circuits, comprising:
    forming a first gate structure over a p-well region and a second gate structure over a n-well region wherein said n-well region and said p-well region are formed in a semiconductor substrate;
    forming first sidewall structures adjacent said first gate structure and second sidewall structures adjacent said second gate structure;
    forming n-type source and drain regions in said p-well region adjacent said first sidewall structure and p-type source and drain regions in said n-well region adjacent said second sidewall structure;
    selectively forming germanium implanted regions in said p-type source and drain regions;
    annealing said germanium implanted regions and said source and drain regions with a rapid thermal anneal at temperatures exceeding 1000° C.;
    forming a nickel metal layer over said source and drain regions; and
    annealing said metal layer to form nickel silicide regions over said source and drain regions.

11. The method of claim 10 further comprising implanting germanium at doses of $1\times10^{14}$ cm$^2$ to $1\times10^{16}$ cm$^2$ at energies of 2 KeV to 50 KeV.

12. The method of claim 10 further comprising implanting germanium into said gate structures.

* * * * *